(12) United States Patent
Noda et al.

(10) Patent No.: US 7,191,511 B2
(45) Date of Patent: Mar. 20, 2007

(54) ELECTRONIC COMPONENT PLACEMENT MACHINE HAVING CAMERA UNITS WITH VERTICALLY OVERLAID APERTURES

(75) Inventors: Kazuhiko Noda, Fukuoka (JP); Hitoshi Mukojima, Fukuoka (JP); Yasuhiro Narikiyo, Fukuoka (JP); Toshiro Hirakawa, Fukuoka (JP); Hiromi Kanaki, Fukuoka (JP); Akira Nishimura, Fukuoka (JP); Osamu Uchida, Fukuoka (JP); Takatoshi Ishikawa, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 101 days.

(21) Appl. No.: 11/033,511

(22) Filed: Jan. 12, 2005

(65) Prior Publication Data

US 2005/0132567 A1   Jun. 23, 2005

Related U.S. Application Data

(62) Division of application No. 10/781,787, filed on Feb. 20, 2004, now Pat. No. 7,007,377.

(30) Foreign Application Priority Data

Feb. 25, 2003  (JP) .............................. 2003-047313
Feb. 25, 2003  (JP) .............................. 2003-047314
Apr. 23, 2003  (JP) .............................. 2003-118274

(51) Int. Cl.
*B23P 19/00* (2006.01)
(52) U.S. Cl. ............................ 29/740; 29/720; 29/739; 29/832; 29/833
(58) Field of Classification Search .................. 29/832, 29/833, 739, 740, 720
See application file for complete search history.

(56) References Cited

U.S. PATENT DOCUMENTS

| 5,342,460 | A | * | 8/1994 | Hidese ........................ 156/64 |
| 5,362,681 | A | * | 11/1994 | Roberts et al. ............. 438/464 |
| 5,491,888 | A | | 2/1996 | Sakurai et al. |
| 5,547,537 | A | * | 8/1996 | Reynolds et al. ........... 156/351 |
| 5,566,447 | A | | 10/1996 | Sakurai |
| 5,839,186 | A | | 11/1998 | Onodera |
| 5,864,944 | A | | 2/1999 | Kashiwagi et al. |
| 6,154,957 | A | | 12/2000 | Tsubouchi et al. |
| 6,446,333 | B1 | | 9/2002 | Kashiwagi et al. |
| 6,466,837 | B1 | | 10/2002 | Mimura et al. |
| 6,606,790 | B2 | | 8/2003 | Hidese |
| 7,020,953 | B2 | * | 4/2006 | Ueno et al. ................. 29/740 |

FOREIGN PATENT DOCUMENTS

| JP | 02-056944 | 2/1990 |
| JP | 02-056945 | 2/1990 |
| JP | 03-029334 | 2/1991 |
| JP | 07-118496 | 12/1995 |
| JP | 09-064104 | 3/1997 |
| JP | 2001-35864 | 2/2001 |
| JP | 2001-060795 | 3/2001 |

* cited by examiner

*Primary Examiner*—Richard Chang
(74) *Attorney, Agent, or Firm*—Wenderoth, Lind & Ponack, L.L.P.

(57) ABSTRACT

An electronic component placement machine and an electronic component placement method are disclosed. A takeout and transfer head, provided on rotary chip takeout and transfer mechanism, removes a chip from a feeder and flips it. A placement head receives the flipped chip and places it onto a board. An image of the chip at a pre-centering recognition position is captured during a takeout and transfer operation, during which the takeout and transfer head transfers the chip to the placement head at a receiving position, so as to recognize the position. Based on this positional recognition result, the chip and the placement head are positioned by controlling a placement head driving mechanism. Moreover, the takeout and transfer head is rotated to a position which does not hinder image capturing of the electronic component for placement positioning.

8 Claims, 11 Drawing Sheets

TTH: Takeout and transfer head

TTH: Takeout and transfer head

ELECTRONIC COMPONENT PLACEMENT MACHINE HAVING CAMERA UNITS WITH VERTICALLY OVERLAID APERTURES

This application is a divisional of U.S. Ser. No. 10/781,787, filed Feb. 20, 2004 now U.S. Pat. No. 7,007,377.

FIELD OF THE INVENTION

The present invention relates to machines and methods for placing electronic components, such as flip chips, onto boards.

BACKGROUND OF THE INVENTION

A demand for higher positional accuracy in placing electronic components onto boards is increasing, and in response, methods are commonly adopted that use image recognition for correcting a positional deviation of an electronic component and board when placing the electronic component onto the board. Examples of this type of electronic component placement machine are disclosed in Japanese Laid-open Applications Nos. H2-56945 and H2-56944.

The machine disclosed in No. H2-56945 is equipped with a flipping device for removing an electronic component from a feeder, and flipping and transferring the electronic component to a predetermined transfer position; and a placement head for receiving and holding this flipped electronic component and then transferring and placing it onto a board.

The electronic component held by the placement head is recognized by a camera to position the component for placement. This technology enables high-speed placement of electronic components with bumps. Operability and positional accuracy are also high.

However, further improvements in productivity are needed as production technology advances rapidly in the electronic component industry.

In the prior art, a placement head needs to stop briefly after receiving an electronic component to allow a camera to recognize the component.

As a result, loss of time often occurs due to reduction of speed of the placement head, on the way to a board, for stopping. This results in a barrier to further reduction of cycle time.

The machine disclosed in No. H2-56944 is equipped with a flipping device for removing an electronic component from a feeder, and flipping and transferring the electronic component to a predetermined transfer position; and a placement head for receiving and holding this flipped electronic component and placing it onto a board. This machine has a pre-centering recognition function to allow the placement head to receive the electronic component after recognizing the flipped electronic component via a camera. This technology. enables placement of an electronic component, with bumps, onto a board with high positional accuracy, after flipping the electronic component.

However, in the above prior art, the placement head needs to retract from a transfer position for standby because pre-centering recognition is executed at the transfer position. A time loss occurs in some cases due to reduction of speed for reducing or stopping movement of the placement head on the way to the transfer position. This provides a limit to reducing cycle time, creating a need for an electronic component placement machine with higher performance.

Moreover, conventional electronic component placement machines for flip chips (hereinafter referred to as "chips") need to provide a component placement level for a board that is significantly higher than a component transfer level for transporting an electronic component, removed from a feeder, to a placement head due to various limitations in machine design. If a difference between these levels is entirely accounted for by vertical movement of the placement head, a lengthened stroke of a z-axis driving mechanism for elevating the placement head typically causes deflection of a shaft, resulting in lower mounting accuracy. If rigidity of the z-axis driving mechanism is improved so as to prevent this type of failure, problems emerge with high-speed operation and brief stoppage due to increased mass of the placement head. This may also result in a longer cycle time.

The present invention aims to offer an electronic component placement machine and electronic component placement method for improving productivity by reducing cycle time while securing mounting accuracy.

SUMMARY OF THE INVENTION

The present invention pertains to an electronic component placement machine for picking up electronic components by using a takeout and transfer head, and receiving and placing the components onto a board by using a placement head. The electronic component placement machine includes a feeder for supplying an electronic component to the takeout and transfer head at a predetermined feeding position; a board holder for holding a board onto which the electronic component is to be placed; a feeder camera unit for capturing an image of the electronic component while in the feeder; a takeout and positioning device for positioning the electronic component relative to the takeout and transfer head based on a positional recognition result of the electronic component obtained by recognition processing of an image taken by the feeder camera unit; a takeout and transfer device for transporting the electronic component, picked up at the feeding position by the takeout and transfer head, to a transfer position while flipping the electronic component during transport; a placement head for receiving this transported electronic component from the takeout and transfer head at the transfer position and placing the electronic component onto the board; a placement head camera unit for capturing an image of the electronic component, held by the placement head at the transfer position, from beneath; and a placement positioning device for positioning the electronic component held by the placement head relative to the board held by the board holder based on a positional recognition result of the electronic component obtained by recognition processing of the image taken by the placement head camera unit. The takeout and transfer head is movable to a position where an image to be captured by the placement head camera unit is not hindered.

The present invention also pertains to an electronic component placement method in which a takeout and transfer head picks up an electronic component from a feeder at a feeding position, and transfers the electronic component to a transfer position; and a placement head receives and then places this electronic component onto a board. This method includes steps of recognizing the feeder for recognizing a position of the electronic component by capturing an image of the electronic component, while in the feeder, using a feeder camera unit; removing and positioning the electronic component relative to the takeout and transfer head based on a positional recognition result of the electronic component obtained during the step of recognizing the feeder; removing the electronic component at the feeding position and transporting the electronic component to the transfer position using the takeout and transfer head; receiving this transported electronic component at the transfer position from the takeout and transfer head using the placement head; recognizing the placement head for recognizing a position of the electronic component by capturing an image of the electronic component, while held by the placement head, from beneath; and placing the electronic component, held by the placement head, onto the board after positioning the electronic component relative to the board while held by a board holder, based on a positional recognition result of the electronic component obtained during the step of recognizing the placement head. During the step of recognizing the placement head, the takeout and transfer head is moved from the transfer position to a position where an image to be captured by the placement head camera unit is not hindered.

DETAILED DESCRIPTION OF PREFERRED EMBODIMENTS

A preferred embodiment of the present invention is described below with reference to drawings.

Figure 1:
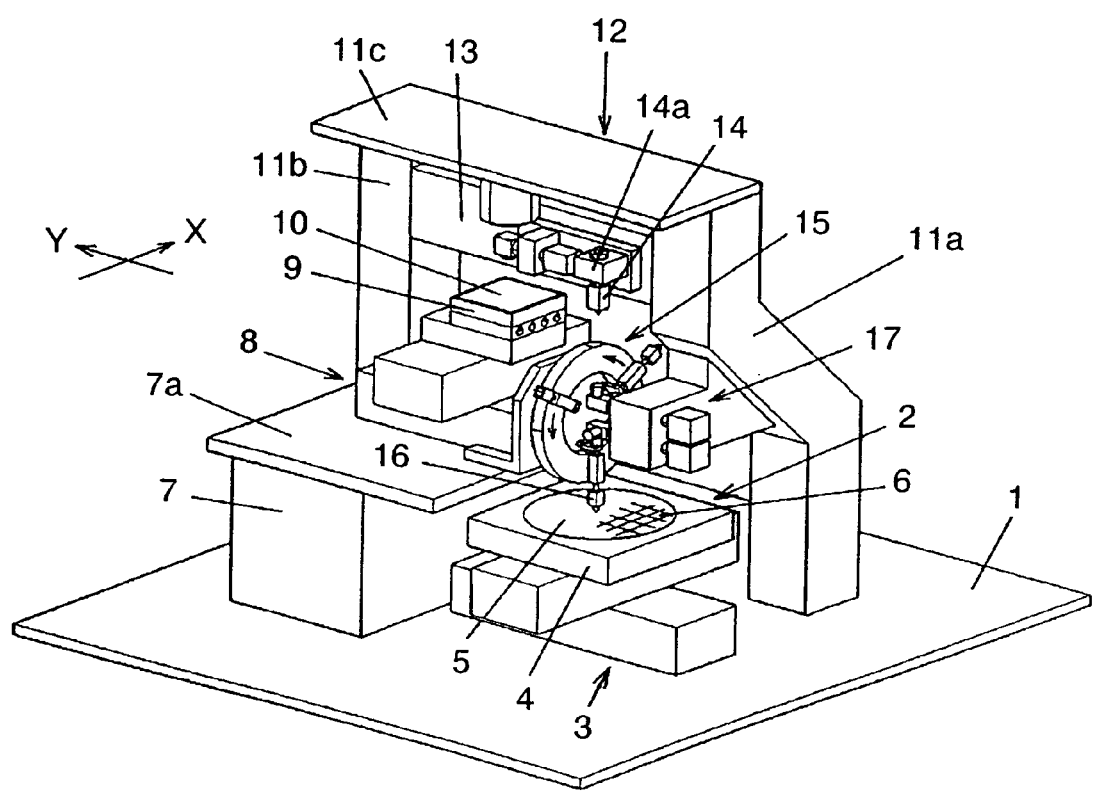
FIG. 1 is a perspective view of an electronic component placement machine in accordance with a preferred embodiment of the present invention.

Drawings are schematic and thus do not show accurate dimensional positions. The present invention refers to a chip as an example of an electronic component. First, a configuration of an electronic component placement machine is described with reference to FIGS. 1 and 2. In FIG. 1, feeder 2 is disposed on a top face of base 1. Feeder 2 is configured by disposing chip holder 4 on a top face of chip holder transfer table 3 which has a structure featuring combined direct-acting tables. Chip holder 4 has wafer sheet 5 on which numerous chips 6 are attached. This wafer sheet 5 is held at a height of a component feeding level. Chips 6 are chips with bumps for external connection. A face of each chip 6 having the bumps thereon is facing upwardly, and a bottom face of each chip is attached to wafer sheet 5. Chip holder 4 horizontally moves together with chips 6 attached to wafer sheet 5 when chip holder transfer table 3 is driven.

Stand 7 is disposed adjacent to feeder 2 on base 1. Board holder transfer table 8 is disposed on top plate 7a of stand 7. Board holder transfer table 8 has a structure featuring combined direct-acting tables. Board holder 9 is disposed on a top face of board holder transfer table 8 for holding board 10, onto which chips 6 are to be placed, at a height of a board holding level. This board holding level is set to be higher than the aforementioned component feeding level. Board holder 9 moves horizontally together with board 10 it is holding by driving board holder transfer table 8.

Chip takeout and transfer mechanism 15 (takeout and transfer device) is held by top plate 7a disposed over feeder 2 such that chip takeout and transfer mechanism 15 protrudes over chip holder 4. Chip takeout and transfer mechanism 15 is a rotary chip takeout unit in which multiple (three in this embodiment) takeout and transfer heads (hereafter referred to as TTHs) 16 are rotatably disposed radially around a horizontal rotating shaft. Feeder 2 supplies chips 6 with bumps facing upwardly to TTHs 16 at a predetermined feeding position.

More specifically, chip takeout and transfer mechanism 15 transports chips 6, removed at a feeding position of feeder 2 by TTHs 16, facing downwardly to a transfer position of placement head 14. This transfer position is set to the component transfer level, which is higher than the component feeding level. During transfer, TTHs 16 rotate about the horizontal rotating shaft. In this way, an orientation of chips 6 is flipped such that the bumps face downwardly. Chip takeout and transfer mechanism 15 takes out chips 6 at the feeding position by TTHs 16, and transfers chips 6 to the transfer position. Moreover, chip takeout and transfer mechanism 15 acts as a transfer and flipping device for flipping chips 6 during transfer.

Side frames 11a and 11b are provided at a back of feeder 2 and on stand 7. Upper parts of side frames 11a and 11b are coupled by top plate 11c. Placement mechanism 12, equipped with placement head 14, is provided between side frames 11a and 11b. Placement head 14 moves horizontally by placement head transfer table 13 installed between side frames 11a and 11b, and rotates in an θ direction about a vertical shaft via placement head rotating mechanism 14a. Placement head transfer table 13 and placement head rotating mechanism 14a configure a placement head transfer mechanism.

TTHs 16 remove chips 6 from feeder 2, and flip and transfer chips 6 to the aforementioned transfer position.

Chips 6 are then passed to placement head 14 in a face-down position, i.e., a bump face is facing downwardly. Placement head 14 receiving chip 6 moves over board 10 held by board holder 9. Placement head 14 then places face-down chip 6 on board 10 by performing a placement operation. More specifically, the aforementioned placement head transfer mechanism moves placement head 14, having received flipped chip 6 from TTH 16, at the transfer position to the board holder.

Side frame 11a is provided with component camera unit 17 extending toward a side face of chip takeout and transfer mechanism 15. As described later, component camera unit 17 captures chip 6 when TTH 16 removes chip 6 from feeder 2 and when placement head 14 receives chip 6, such removed, so as to recognize its position.

Next, a detailed configuration of each part is described with reference to FIGS. 2, 3, and 4. First, a configuration of chip takeout and transfer mechanism 15 is described. As shown in FIG. 3, TTH base 20 is rotatably held around rotating shaft 20a via bracket 19 located on a top face of top plate 7a. A TTH base rotating mechanism, described later, allows rotation of TTH base 20 in any operational pattern, including stoppage at a predetermined indexing position and fine adjustment of a rotational stop position.

On TTH base 20, three TTHs 16 are disposed at radially trisected positions, centered on rotating shaft 20a.

TTH 16 moves forward and backward in respective head shaft directions (in a direction normal to TTH base 20) by TTH elevating and rotating mechanism (or head holder) 16a, and can also rotate about a head shaft.

Each TTH 16 has a suction nozzle at its tip, and chip 6 is vacuum-held by this suction nozzle.

A mechanism for rotating TTH 16 is not essential.

Figure 2:
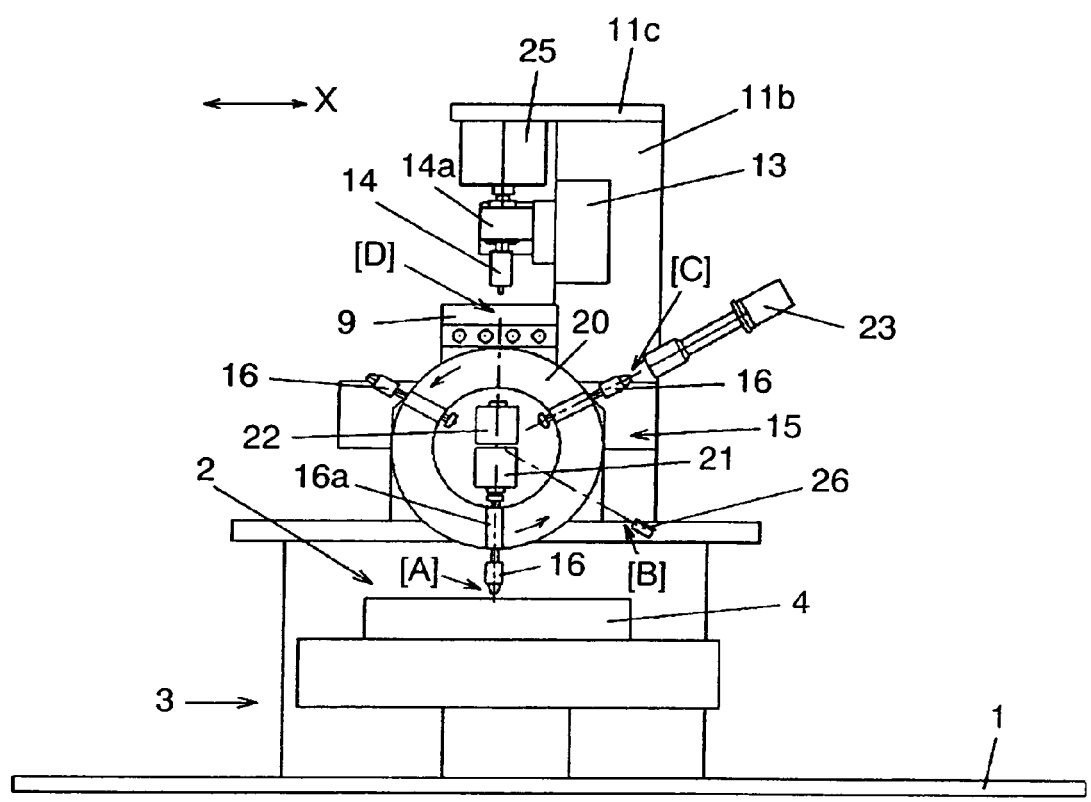
FIG. 2 is a front view of the electronic component placement machine in accordance with the preferred embodiment of the present invention.
Figure 3:
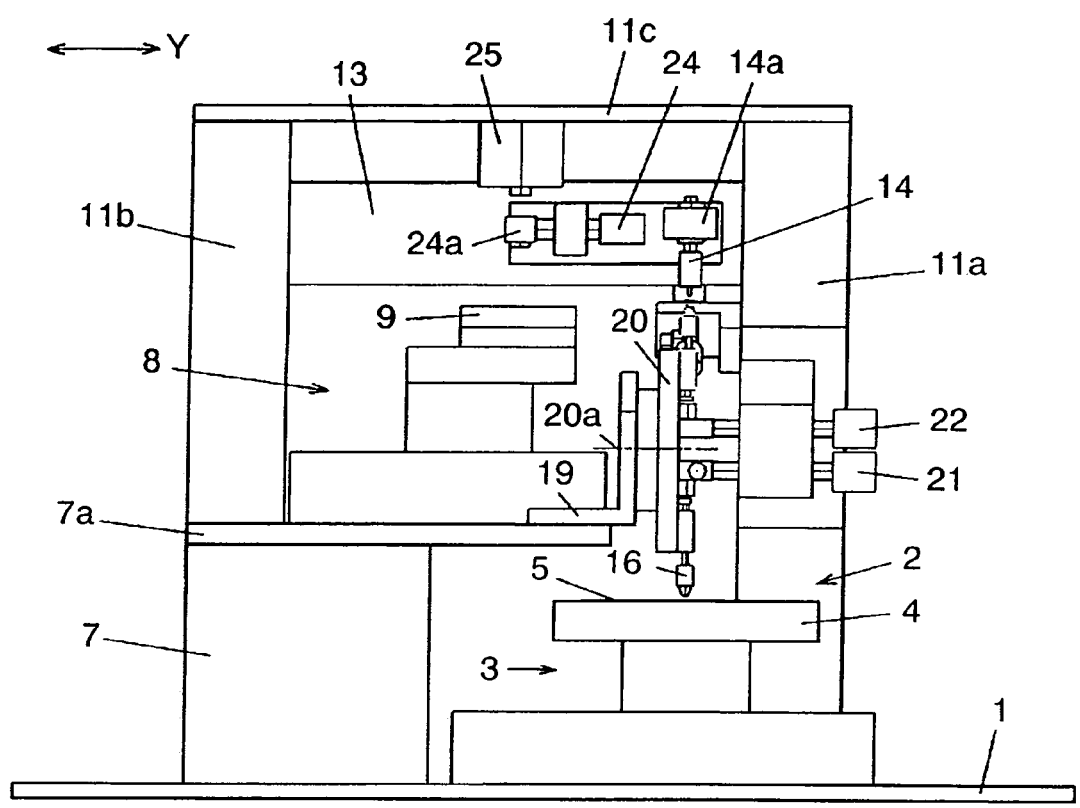
FIG. 3 is a side view of the electronic component placement machine in accordance with the preferred embodiment of the present invention.

As shown in FIGS. 2 and 3, TTH 16 is located at predetermined feeding position [A], set on feeder 2, when TTH 16 faces vertically downwardly. In this state, a takeout and elevating device, described later, lowers TTH 16. TTH 16 vacuum-holds chip 6 on wafer sheet 5 by vacuuming the bump face of chip 6 using the suction nozzle. In this state, TTH 16 rises to remove chip 6 from feeder 2. TTH 16, holding chip 6 in this way, is then rotated 60 degrees counterclockwise so that TTH 16 moves to chip detecting position [B]. Chip detecting sensor 26 is disposed on an outer side of chip detecting position [B], and detects presence of chip 6 on the suction nozzle of TTH 16. Pre-centering recognizing position [C] is located at 60 degrees further counterclockwise from chip detecting position [B].

Figure 4:
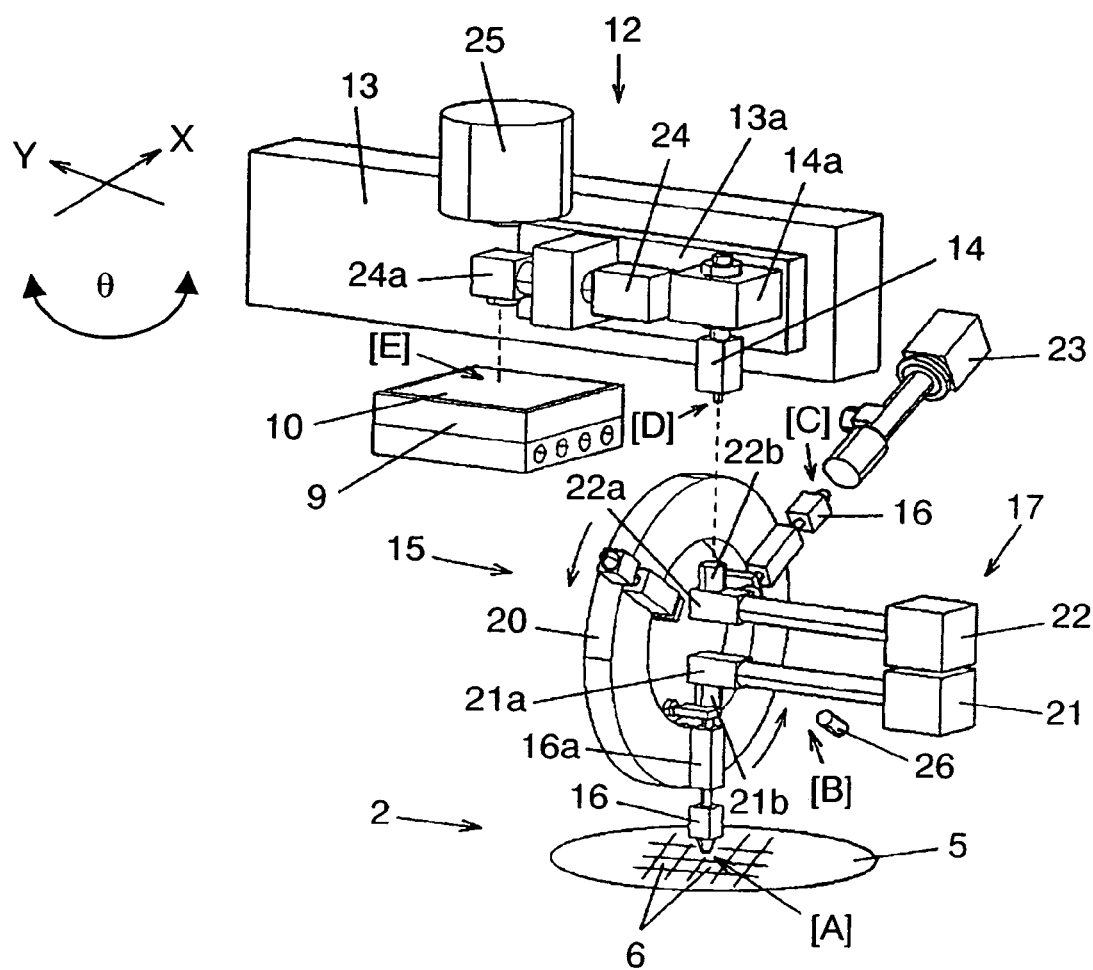
FIG. 4 is a fragmentary perspective view of the electronic component placement machine in accordance with the preferred embodiment of the present invention.

As shown in FIG. 4, pre-centering recognizing camera 23 is disposed on an outer side of pre-centering recognizing position [C]. Pre-centering recognizing camera 23 captures an image of chip 6 held by TTH 16. In other words, pre-centering recognizing camera 23 is a TTH camera unit for capturing an image of chip 6 held by TTH 16 during removal and transfer of chip 6. The position of chip 6, when held by TTH 16, is recognized by processing this image.

Receiving position [D] is located at 60 degrees further counterclockwise from pre-centering recognition position [C], i.e. at a vertical upright position, and placement head 14 receives chip 6 from TTH 16 at this position (same as transfer position [D] where TTH 16 passes chip 6 to placement head 14). A transfer and elevating device, described later, lifts TTH 16 in a state of TTH 16 facing upwardly while holding chip 6. Then, TTH 16 passes face-down chip 6 to placement head 14. Chip 6 can also be transferred by vertically moving placement head 14.

In a chip transfer operation of this placement head 14 (chip transfer to placement head 14), chip takeout and transfer mechanism 15 and placement head driving mechanism (placement head transfer table 13 and placement head rotating mechanism 14a) are controlled based on a positional recognition result of chip 6 at pre-centering recognition position [C]. Accordingly, chip 6 and placement head 14 are relatively positioned.

More specifically, chip 6 and placement head 14 are positioned in each direction by fine adjustment of a rotational stop position of TTH base 20 with respect to X direction, movement of placement head 14 using placement head transfer table 13 with respect to Y direction, and placement head rotating mechanism 14a with respect to θ direction.

Next, component camera unit 17 is described. As shown in FIG. 4, feeder recognition camera 21 and placement head recognition camera 22 are disposed in component camera unit 17 in such a way that their image-pickup optical axes are horizontal. Feeder recognition camera 21 and placement head recognition camera 22 respectively have feeder image-pickup optical system 21a and placement head image-pickup optical system 22a, which horizontally extend toward a side of TTH base 20. Each of feeder image-pickup optical system 21a and placement head image-pickup optical system 22a is an L-shape image-pickup optical system, which has a function to perpendicularly refract an image-pickup axis from an aperture.

The aperture (feeder aperture 21b) of feeder image-pickup optical system 21a is located upright over feeding position [A] so as to let image-pickup light from feeding position [A] enter feeder recognition camera 21. This allows feeder recognition camera 21 to capture, from above, an image of chip 6 on wafer sheet 5 at feeding position [A] of feeder 2. Feeder recognition camera 21 and feeder image-pickup optical system 21a configure a feeder image-pickup device for capturing an image of chip 6 in feeder 2. This image pickup of chip 6 in feeding position [A] by the feeder image-pickup device occurs when all three TTHs 16 rotate from feeding position [A], i.e., while TTHs 16 are moved to positions which do not hinder image capture by the feeder image-pickup device. Placement head aperture 22b (an aperture of placement head image pickup optical system 22a) is underneath receiving position [D], so as to let image-pickup light from receiving position [D] enter placement head recognition camera 22. This allows placement head recognition camera 22 to capture an image of chip 6 when held by placement head 14 at receiving position [D]. Placement head recognition camera 22 and placement head image-pickup optical system 22a configure a placement head image-pickup device. This image pickup of chip 6 by the placement head image-pickup device occurs when all three TTHs 16 rotate from receiving position [D], i.e., while TTHs 16 are moved to positions which do not hinder image capture by the placement head image-pickup device.

In the above configuration, feeder image-pickup optical system 21a is vertically overlaid with feeding position [A] and transfer position [D] because these positions are located on the same vertical line. More specifically, aperture 21b of the feeder image-pickup device is disposed at a position that vertically overlays feeding position [A] and transfer position [D]. In other words, aperture 21b of the feeder image-pickup device is disposed between feeder position [A] and transfer position [D]. Accordingly, the machine can be downsized compared to a case of disposing an aperture of a feeder image-pickup device over a transfer position.

Moreover, in the above configuration, feeder image-pickup optical system 21a and placement head image-pickup optical system 22a are located on the same vertical line as feeding position [A] and transfer position [D], and thus these are vertically overlaid. In other words, the apertures of the feeder image-pickup device and placement head image-pickup device are vertically overlaid. This allows provision of two recognition devices for recognizing chip 6 at two different positions in a vertically overlaid fashion. Accordingly, the machine can be miniaturized compared to a case of disposing two recognition devices in parallel.

Next, placement head 14 is described. As shown in FIG. 4, placement head 14 and board recognition camera 24 are disposed in an integrally movable fashion on transfer base 13a, which is horizontally moved by placement head transfer table 13. Placement head 14 is rotatable about a head shaft by a placement head rotating mechanism 14a. In addition, an upward force is applied to placement head 14 by a spring (not illustrated) provided along a guide (not illustrated) created in placement head rotating mechanism 14a.

Still more, placement head 14 is lowered by being pushed from above by placement head pressing mechanism 25 described later. Accordingly, placement head 14 is vertically movable along a vertical head shaft by the spring provided on placement head rotating mechanism 14a, and placement head pressing mechanism 25. A mechanism to vertically move placement head 14 can also be provided on placement head rotating mechanism 14a. Placement head 14, after receiving chip 6 from TTH 16 at receiving position [D], moves over board 10 held by board holder 9 by placement head transfer table 13. Then, placement head 14 places chip 6, which it holds, onto board 10.

Board recognition camera 24 disposed on transfer base 13a is equipped with board image-pickup optical system 24a extending horizontally. Board image-pickup optical system 24a is positioned over board 10 when placement head 14 is at receiving position [D]. By capturing an image of board 10 by board recognition camera 24 in this state, placement point [E] of chip 6 on board 10 is captured, and a position of placement point [E] is recognized by processing this image. Alternatively, board recognition camera 24 can be fixed, and board 10 can be moved to an image-pickup position of board recognition camera 24 by board holder transfer table 8.

During operation of placement head 14 to place chip 6 onto board 10, chip 6 is positioned relative to board 10 based on a positional recognition result of placement point [E] on board 10, obtained in this way, and a positional recognition result of chip 6 obtained by capturing an image of chip 6 by placement head recognition camera 22.

X and Y directions are positioned by moving board 10 by board holder transfer table 8 to set placement point [E] directly underneath a placement position of placement head 14. A θ direction is positioned by θ rotation of placement head 14 via placement head rotating mechanism 14a.

When placement head 14 is lowered to place chip 6, held by placement head 14, onto board 10, placement head pressing mechanism 25, disposed fixedly on a bottom face of top plate 11c, applies a downward force to placement head 14, and thus chip 6 is pressed against board 10 via placement head 14. Fixing of placement head pressing mechanism 25 separately from placement head 14 enables reduction of a weight of placement head 14, thereby making a high-speed operation feasible. In addition, an advantage is realized in that placement head pressing mechanism 25 can be replaced corresponding to a mounting load of a target chip.

Figure 5:
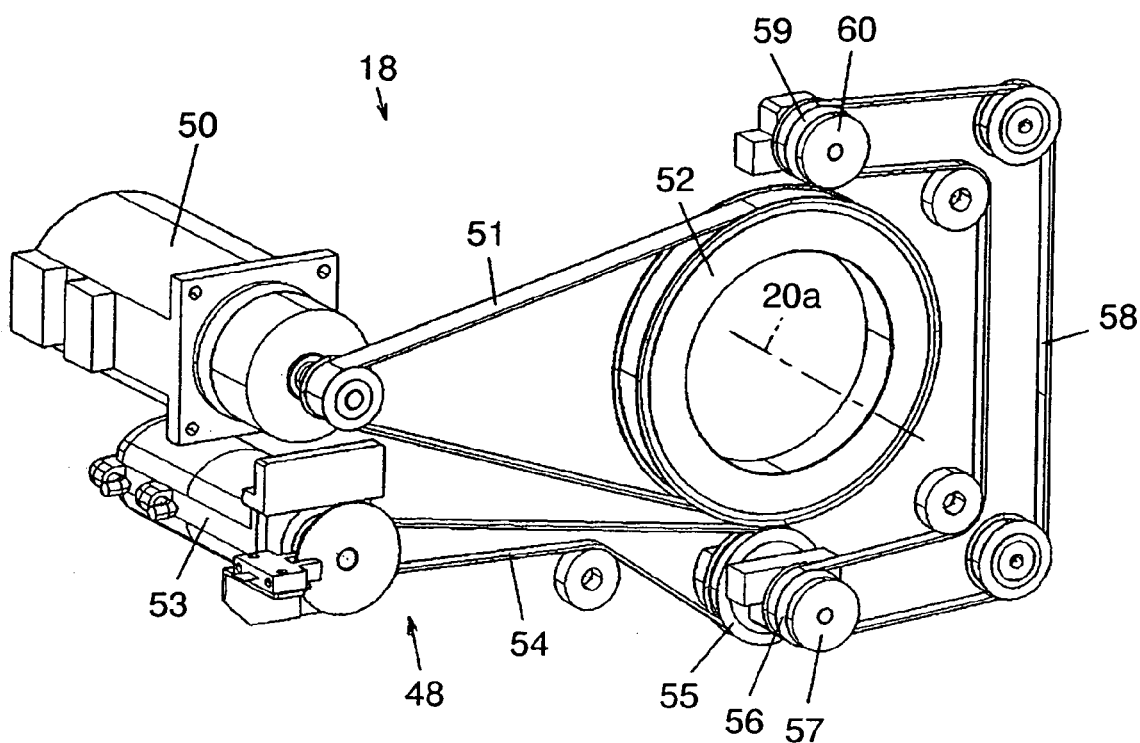
FIG. 5 is a fragmentary perspective view of a driving system of the electronic component placement machine in accordance with the preferred embodiment of the present invention.

Next, TTH base rotating mechanism 18 and TTH elevating mechanism 48 of the electronic component placement machine are described with reference to FIGS. 5 and 6. In FIG. 5, first pulley 52 is coaxially coupled to rotating shaft 20a (FIG. 3) of TTH base 20 (FIGS. 2 to 4). This allows TTH base 20 to rotate integrally with first pulley 52 via a coupling mechanism (not illustrated). Motor 50 rotates first pulley 52 via belt 51. TTH base 20 can be rotated in any operational pattern, including stoppage, at a predetermined indexing position and fine adjustment of a rotational stop position by controlling a rotational pattern of motor 50.

Next, TTH elevating mechanism 48 is described. In FIG. 5, second pulley 55, third pulley 56, and first disk cam 57 are coaxially disposed under first pulley 52. Fourth pulley 59 and second disk cam 60 are coaxially disposed over first pulley 52. Positions of first disk cam 57 and second disk cam 60 correspond to feeding position [A] and transfer position [D], as shown in FIG. 6. First disk cam 57 and second disk cam 60 each have a cam characteristic of reciprocation at a predetermined stroke during a particular phase.

Motor 53 rotates second pulley 55 via belt 54. Belt 58 is adjusted and set to third pulley 56 and fourth pulley 59, detouring first pulley 52. Accordingly, first disk cam 57 and second disk cam 60 synchronize and rotate when motor 53 is driven.

Figure 6:
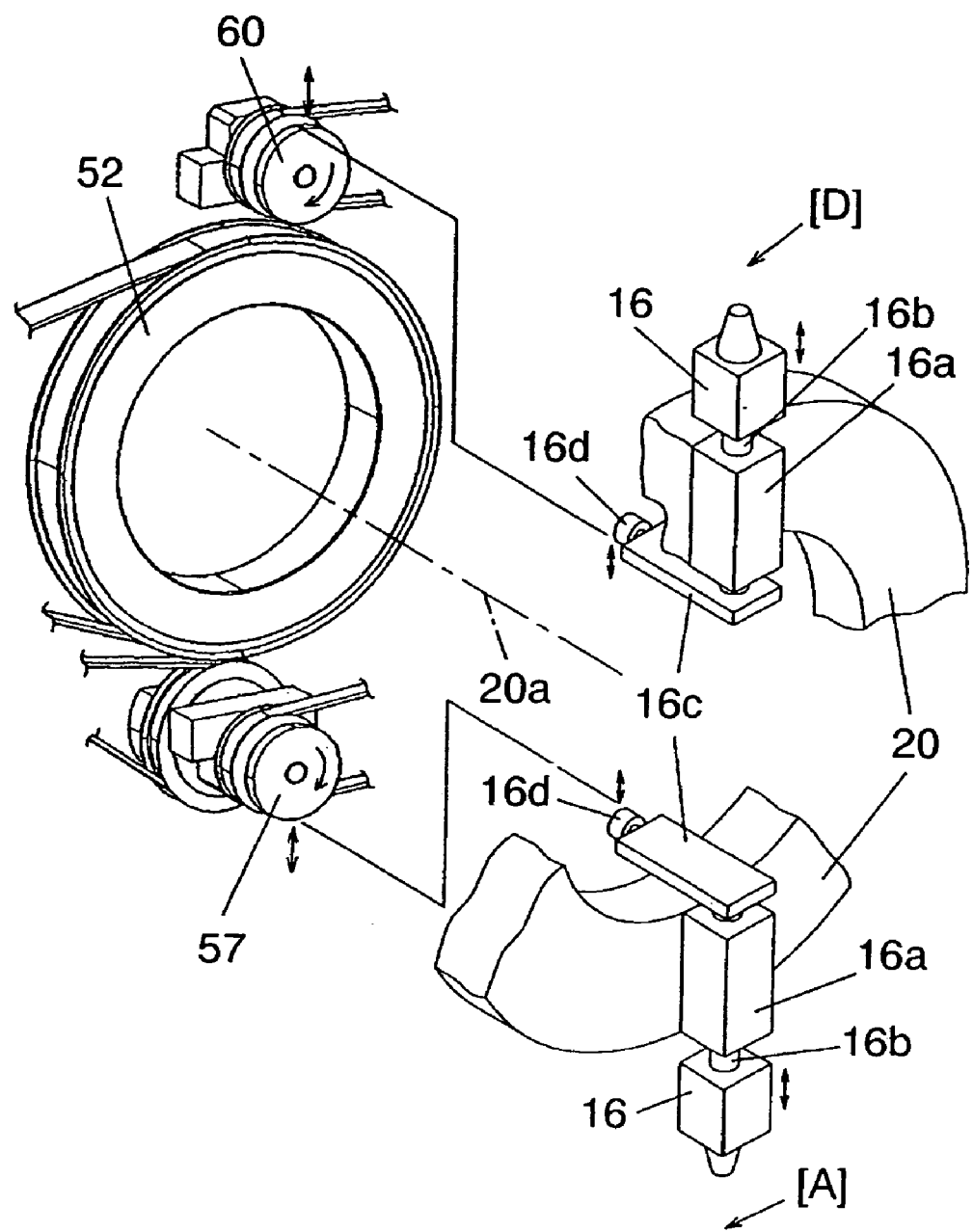
FIG. 6 is a fragmentary perspective view of a cam unit in a takeout and transfer head elevating mechanism of the electronic component placement machine in accordance with the preferred embodiment of the present invention.

As shown in FIG. 6, TTH 16 is held by head holder 16a, attached to TTH base 20, in a forward/backward movable fashion by inserting shaft 16b into head holder 16a. Plate 16c, attached to cam follower 16d, is coupled to an inner (inner direction of TTH base 20) end of shaft 16b. A radial position of cam follower 16d, centered on rotating shaft 20a, is a position that contacts a bottom face of first disk cam 57 and a top face of second disk cam 60.

TTH 16 intermittently rotates about rotating shaft 20a, and stops when TTH 16 reaches feeding position [A] and transfer position [D]. When TTH 16 stops, cam followers 16d are at positions contacting first disk cam 57 and second disk cam 60, respectively.

First disk cam 57 and second disk cam 60 rotate respectively by rotating motor 53 in this state. Cam follower 16d thus vertically reciprocates during a predetermined stroke at a predetermined time corresponding to a cam characteristic. Accordingly, TTH 16, coupled to cam follower 16d via plate 16c and shaft 16b, vertically moves during a predetermined stroke.

In other words, cam follower 16d, first disk cam 57, and motor 53 configure a takeout and elevating device for vertically moving TTH 16 at feeding position [A]. By this vertical movement, TTH 16 removes chip 6 from feeder 2. In addition, cam follower 16d, second disk cam 60, and motor 53 configure a transfer and elevating device for vertically moving TTH 16 at transfer position [D]. By this vertical movement, TTH 16 transfers a held chip 6 to placement head 14.

Motor 53 drives both takeout and elevating device, and the transfer and elevating device. Therefore the motor 53 is a common driving source of these devices.

It is apparent that TTH base rotating mechanism 18 does not necessarily need to be configured as described above. TTH base 20 can be directly coupled to a rotating mechanism such as a motor for direct rotation.

In addition, the takeout and elevating device and the transfer and elevating device do not necessarily need to be configured as described above. For example, these devices can be vertically moved individually using a direct-acting mechanism formed by combining a motor and ball screw.

Figure 7:
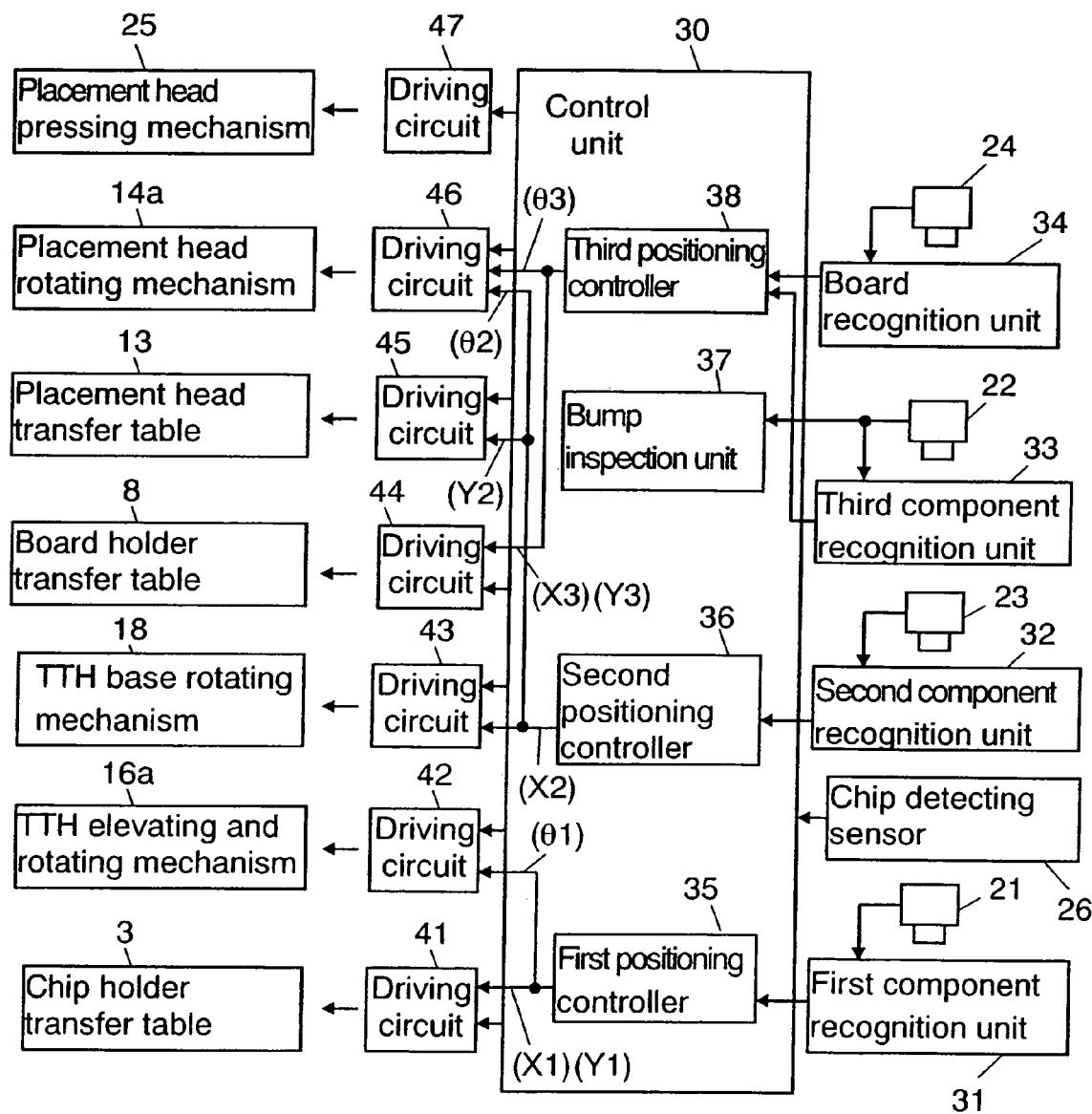
FIG. 7 is a function block diagram illustrating operation of the electronic component placement machine in accordance with the preferred embodiment of the present invention.

Next, a processing function of a control system for the electronic component placement machine is described with reference to FIG. 7. Feeder recognition camera 21, pre-centering recognition camera 23, placement head recognition camera 22, and board recognition camera 24 are respectively coupled to first component recognition unit 31, second component recognition unit 32, third component recognition unit 33, and board recognition unit 34. First component recognition unit 31, second component recognition unit 32, third component recognition unit 33, and board recognition unit 34 recognize a position of an image target by executing image processing on image data obtained respectively by feeder recognition camera 21, pre-centering recognition camera 23, placement head recognition camera 22, and board recognition camera 24.

Recognition results obtained by first component recognition unit 31, second component recognition unit 32, third component recognition unit 33, and board recognition unit 34 are sent to control unit 30. Control unit 30 has control programs for outputting a required positioning command to each driving mechanism when control unit 30 receives recognition results. Positioning is controlled as described below by executing these control programs.

Each recognition target item is described below. A recognition result of chip 6 on wafer sheet 5 obtained by first component recognition unit 31 is sent to first positioning controller 35. This first positioning controller 35 calculates travel distances (X1), (Y1), and (θ1) for positioning chip 6 relative to TTH 16 based on a recognition result of chip 6 at feeding position [A].

Out of these travel distances, (X1) and (Y1) are output to driving circuit 41. Driving circuit 41 drives chip holder transfer table 3 so as to position chip 6 in X and Y directions based on these travel distances (X1) and (Y1) and a control command from control unit 30. Driving circuit 42 drives TTH elevating mechanism 48 so as to vertically move TTH 16 based on the control command from control unit 30. Travel distance (θ1) is output to driving circuit 42. Driving circuit 42 drives TTH elevating and rotating mechanism 16a based on travel distance (θ1) and the control command from control unit 30 so as to position chip 6 in θ direction as required. Positioning in the θ direction can also be executed by driving chip holder transfer table 3. Or, positioning in the θ direction does not need to be executed.

In other words, first positioning controller 35 and chip holder transfer table 3 configure a takeout and positioning device for positioning chip 6 relative to TTH 16 based on the positional recognition result of chip 6 obtained by processing an image taken by the feeder recognition camera 21.

An image taken by second component recognition unit 32 is sent to second positioning controller 36. Second positioning controller 36 outputs data indicating travel distances (X2), (Y2), and (θ2) for positioning chip 6, held by TTH 16 at receiving position [D], relative to placement head 14 based on data indicating positional deviation of chip 6 held by TTH 16 at pre-centering recognition position [C].

With regard to these pieces of data, travel distance (X2) is sent to driving circuit 43, travel distance (Y2) is output to driving circuit 45, and travel distance (θ2) is output to driving circuit 46. Driving circuit 43 drives TTH base rotating mechanism 18 based on travel distance (X2) and the control command from control unit 30. Accordingly, a rotational stop position of TTH base 20 is finely adjusted corresponding to positional deviation, and thus chip 6 is positioned in X direction. Driving circuits 45 and 46 drive placement head transfer table 13 and placement head rotating mechanism 14a, respectively, based on travel distances (Y2) and (θ2) so as to position chip 6 in Y and θ directions.

Accordingly, second positioning controller 36, TTH base rotating mechanism 18, placement head transfer table 13, and placement head rotating mechanism 14a control at least one of the placement head driving mechanism and the takeout and transfer device based on a positional recognition result of chip 6 obtained by processing an image taken by the placement head recognition camera 22. In this way, a precentering positioning device for positioning placement head 14 at receiving position [D] relative to chip 6, held by takeout head 16, is configured.

Next, a recognition result of third component recognition unit 33 is sent to third positioning controller 38. Third positioning controller 38 also receives a recognition result of placement point [E] on board 10 from board recognition unit 34.

Third positioning controller 38 adds positional deviation of chip 6 relative to placement head 14 and positional deviation of placement point [E] on board 10 so as to output data on travel distances (X3), (Y3), and (θ3) for placing chip 6 onto board 10 by placement head 14.

Travel distances (X3) and (Y3) in X and Y directions are sent to driving circuit 44, and board holder transfer table 8 is driven based on data of these travel distances (X3) and (Y3) and the control command from control unit 30.

Travel distance (θ3) in θ direction is output to driving circuit 46, and placement head rotating mechanism 14a is driven based on data of this travel distance (θ3) and the control command from control unit 30.

Accordingly, third positioning controller 38, board holder transfer table 8, and placement head rotating mechanism 14a configure a placement positioning device for positioning chip 6, held by placement head 14, relative to board 10, held by board holder 9, based on a positional recognition result of chip 6 obtained by processing an image taken by the placement head recognition camera 22.

Placement head recognition camera 22 outputs image data of a bottom face of chip 6, held by placement head 14, to bump inspection unit 37.

Bump inspection unit 37 inspects presence of bump, bump size, a flaw on bump, and the like on a bump face of chip 6 by processing this image data. The control command from control unit 30 is output to driving circuit 47, and placement head pressing mechanism 25 is driven in accordance with this driving command. Accordingly, a pressing load corresponding to a mounting load of chip 6 is transmitted to placement head 14 when placement head 14 places chip 6.

Figure 8:
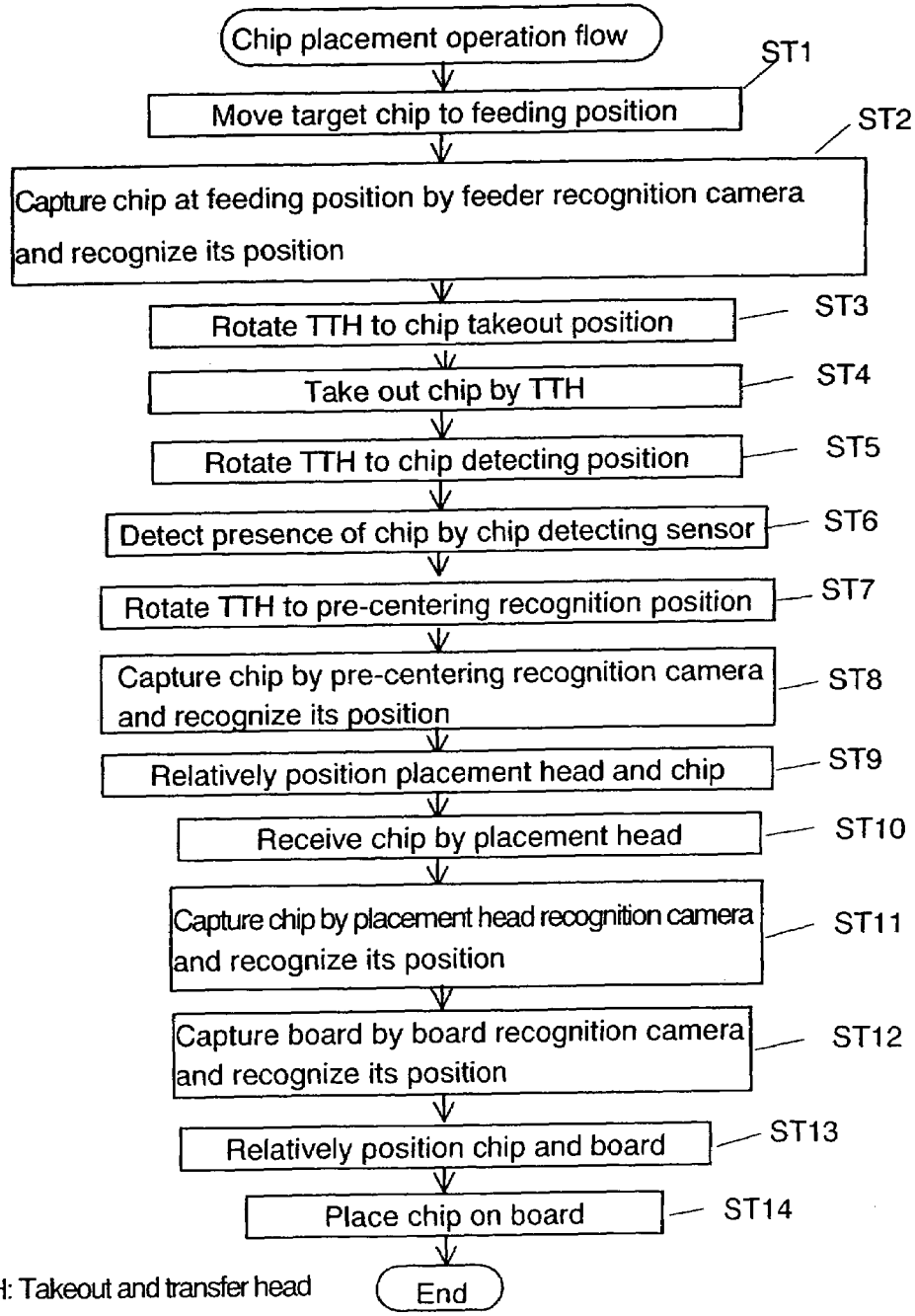
FIG. 8 is a flow chart illustrating a chip placement operation performed by the electronic component placement machine in accordance with the preferred embodiment of the present invention.

The electronic component placement machine is configured as described above. Next, operation of this machine is described with reference to FIGS. 8, 9, and 10. First, a placement operation for removing chip 6 from feeder 2 and placing it on board 10 is described with reference to FIG. 8. A series of operations described here show a method of placing electronic components by removing chip 6 from feeder 2 at feeding position [A] by TTH 16, transferring chip 6 to receiving position [D], and receiving this chip 6 and placing it onto board 10 by placement head 14. In other words, a series of operations described here show a method of placing electronic components by removing chip 6 from feeder 2 by TTH 16 at feeding position [A] set to a height of a component feeding level, transferring chip 6 from TTH 16 to placement head 14 at transfer position [D] set to a height of a component transfer level which is higher than the component feeding level, and placing chip 6 onto board 10 held at a board holding level which is higher than the component feeding level.

First, target chip 6, from among chips 6 attached to wafer sheet 5, to be placed during an applicable placement operation is transferred to feeding position [A]. (ST1).

Next, feeder recognition camera 21 captures an image of chip 6 at feeding position [A], and first component recognition unit 31 recognizes a position of chip 6. (ST2) (Feeder recognition step). During this feeder recognition step, feeder recognition camera 21 captures an image of chip 6 after TTH 16 is moved from feeding position [A] to a position which does not hinder image capture by the feeder camera unit.

Next, applicable TTH 16 for this operation is rotated to a chip takeout position corresponding to feeding position [A] (ST3).

At this point, chip holder transfer table 3 is driven to position chip 6 relative to TTH 16 at feeding position [A] based on a positional recognition result of chip 6 obtained during the feeder recognition step (takeout positioning step).

The takeout positioning step is also called a first positioning step.

In subsequent steps, a 'component' refers to a chip as an example.

Next, TTH 16 removes chip 6 (ST4, component takeout step), and transfers this chip 6 to receiving position [D] during a takeout and transfer step. More specifically, TTH base 20 is intermittently rotated 60 degrees at a time (⅙ rotation) to rotate and move TTH 16, holding chip 6, to chip detecting position [B] (ST5). Then, chip detecting sensor 26 detects presence of chip 6 (ST6, component detecting step).

If no chip 6 is detected during this step, applicable TTH 16 does not conduct an operation described below, and presence of a chip is checked for next TTH 16, and the following operations are executed.

TTH 16 holding chip 6 rotates and moves to pre-centering recognition position [C] (ST7). Here, pre-centering recognition camera 23 captures an image of chip 6 to prepare for relatively positioning placement head 14 and chip 6 by recognizing a position of chip 6 using second component recognition unit 32 (ST8, pre-centering preparation step).

Then, TTH 16 rotates and moves to receiving position [D] to relatively position placement head 14 and chip 6 (ST9, pre-centering positioning step), and placement head 14 receives chip 6 (ST10, component receiving step).

TTH 16 transfers removed chip 6 to transfer position [D], and chip 6 is flipped during transfer. This step is also called a transfer and flipping step. The component receiving step is also called a component transfer step.

During this second positioning step (pre-centering positioning step), at least one of the placement head driving mechanism and the takeout and transfer device is controlled based on a positional recognition result of chip 6 obtained by recognition processing of an image taken by pre-centering recognition camera 23, which is the aforementioned TTH camera unit. Accordingly, placement head 14 is positioned relative to chip 6, held by TTH 16, at receiving position [D]. Receiving of the chip during (ST10), that is component transfer, is executed by vertically moving TTH 16, holding chip 6, by the aforementioned transfer and elevating device.

Accordingly, recognition of position of chip 6 in advance while being transferred to receiving position [D] eliminates a need for pre-centering recognition at receiving position [D], which has been required in a conventional machine.

Placement head 14 thus does not need to retract from transfer position [D] for pre-centering recognition, and can receive chip 6 as soon as TTH 16 reaches receiving position [D].

When placement head 14 receives chip 6, an image of this chip 6 is captured by placement head recognition camera 22, and third component recognition unit 33 recognizes a position of chip 6 (ST11, placement head recognition step).

Capturing of the image by placement head recognition camera 22 during this placement head recognition step is implemented by rotating and moving TTH 16 from receiving position [D] to a position that does not hinder image capture by placement head recognition camera 22. In line with positional recognition of chip 6, board recognition camera 24 captures an image of board 10 to recognize a position of placement point [E] by board recognition unit 34 (ST12).

Placement head 14, after receiving chip 6, goes straight to a placement position over board 10 without any stop after the image of chip 6 is captured.

Then, chip 6 and board 10 are relatively positioned based on a positional recognition result of chip 6 and a positional recognition result of placement point [E] (ST13, third positioning step). Chip 6 is finally placed onto board 10 by lowering placement head 14 and pressing the chip via placement head pressing mechanism 25 (component placement step).

The above flow describes operational sequences for removing chip 6 by single TTH 16. During practical operation of the machine, three TTHs 16, provided on chip takeout and transfer mechanism 15, consecutively remove chips 6 from feeder 2, and placement head 14 receives chips 6 consecutively.

This consecutive operation is described with reference to FIGS. 9 and 10(A)–10(F).

Figure 9:
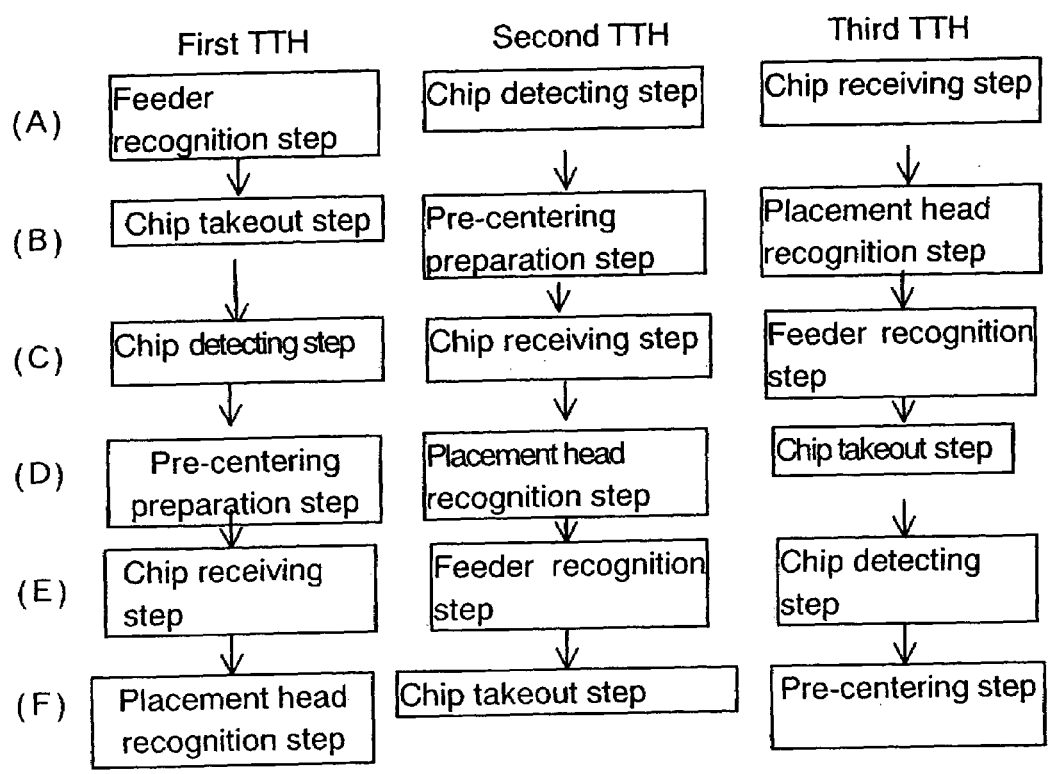
FIG. 9 is a flow chart illustrating a chip removal operation of the electronic component placement machine in accordance with the preferred embodiment of the present invention.

FIG. 9 differentiates three TTHs 16 as first TTH 16A, second TTH 16B, and third TTH 16C, and operational steps executed by each TTH are indicated in parallel. Steps performed at specific times (A)–(F) are described below. FIGS. 10A to 10F show operation of each TTH at times (A) to (F) in FIG. 9.

Figure 10A:
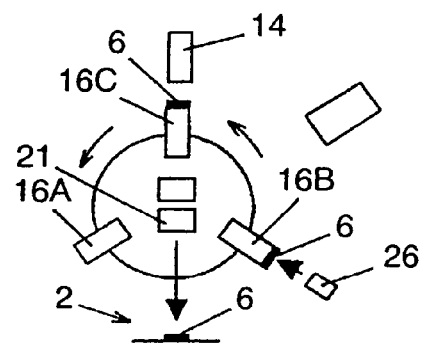
FIGS. 10A–10F illustrate a chip removal operation of the electronic component placement machine in accordance with the preferred embodiment of the present invention.
Figure 10D:
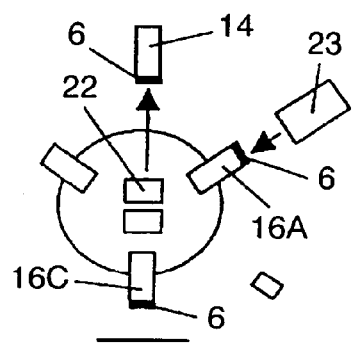

At time (A) in FIG. 10A, the following steps are executed by first TTH 16A, second TTH 16B, and third TTH 16C. More specifically, first TTH 16A executes a feeder recognition step for recognizing a position by capturing an image of chip 6 in feeder 2 using feeder recognition camera 21. Second TTH 16B executes a chip detection step for detecting presence of chip 6 by chip detecting sensor 26. Third TTH 16C executes a chip receiving step for transferring held chip 6 to placement head 14.

Figure 10B:
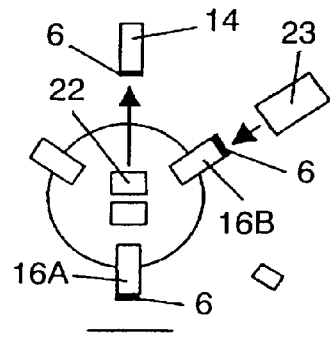
Figure 10E:
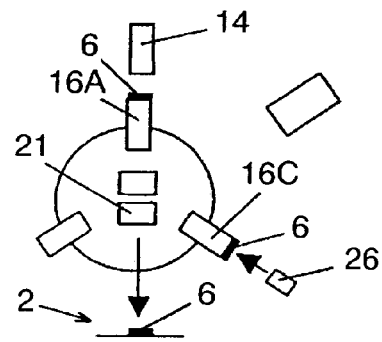
Figure 10C:
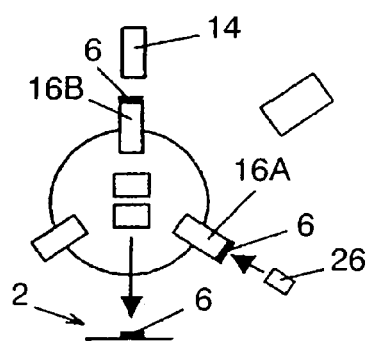
Figure 10F:
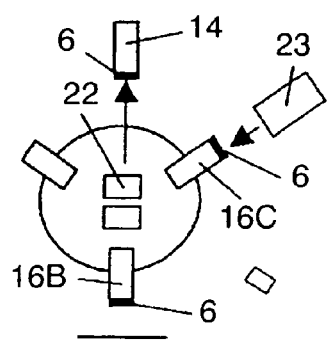

Then, at time (B) after rotating TTH base 20 a ⅙ turn counterclockwise, first TTH 16A, second TTH 16B, and third TTH 16C execute the following steps respectively as shown in FIG. 10B.

More specifically, first TTH1 6A executes a chip removal step for removing chip 6 from feeder 2, second TTH 16B executes a pre-centering preparation step for recognizing a position by capturing an image of chip 6 using pre-centering recognition camera 23, and third TTH 16C executes a placement head recognition step for recognizing a position by capturing an image of chip 6, held by placement head 14, using placement head recognition camera 22.

Then, at subsequent times (C), (D), (E), and (F), steps at the above times (A) and (B) are sequentially executed by first TTH 16A, second TTH 16B, and third TTH 16C, with applicable heads sequentially shifted counterclockwise.

This allows rotary chip takeout and transfer mechanism 15, in which three TTHs 16 are disposed at radially trisected positions, to execute each operation from removing chip 6 in feeder 2 and flipping chip 6, to transferring chip 6 to placement head 14 at receiving position [D], using only TTH 16 without passing over chip 6. This achieves efficient consecutive operation.

Rotary chip takeout and transfer mechanism 15 adopts a configuration such that the placement head camera unit is disposed directly underneath receiving position [D] (same as transfer position [D]). Consequently, chip 6 can be immediately recognized after placement head 14 receives chip 6 and as soon as TTH 16 moves from receiving position [D] to a position that does not hinder image capture by the placement head camera unit. This eliminates a need of a brief stoppage of placement head 14 after receiving the chip (after transferring the chip), thereby reducing cycle time.

Moreover, the present invention adopts a layout of the feeder camera unit for recognizing chip 6 at feeding position [A], and the placement head camera unit in a way such that their imaging visual fields are vertically overlaid. This achieves an extremely compact assembly of two types of camera units, i.e., placement head camera unit and feeder camera unit, in takeout and transfer mechanism 15.

Still more, rotational stop positions set on rotational passage of TTH 16, rotating from feeding position [A] to receiving position [D], are used as chip detecting position [B] and pre-centering recognition position [C] so that a compact and high performance electronic component placement machine is achievable.

Still more, in the above component transfer step, TTH 16 holding chip 6 is vertically moved. This enables reduction of weight of placement head 14 by minimizing an elevating stroke of placement head 14, thereby allowing placement head 14 to perform a high-speed operation and quick stop. As a result, cycle time can be reduced and productivity can be improved while securing mounting accuracy, which was difficult in the prior art in which the TTH does not vertically move.

Still more, rotary chip takeout and transfer mechanism 15, in which three TTHs 16 are disposed at radially trisected positions, efficiently executes consecutive operational steps of removing chip 6 from feeder 2, flipping chip 6, and transferring chip 6 to placement head 14, using only TTH 16 without passing over chip 6.

Still more, the present invention adopts a layout of the feeder camera unit for recognizing chip 6 at feeding position [A], and the placement head camera unit in a way such that their apertures are vertically overlaid. This achieves an extremely compact assembly of two types of camera units, i.e., placement head camera unit and feeder camera unit, in takeout and transfer mechanism 15.

Figure 11A:
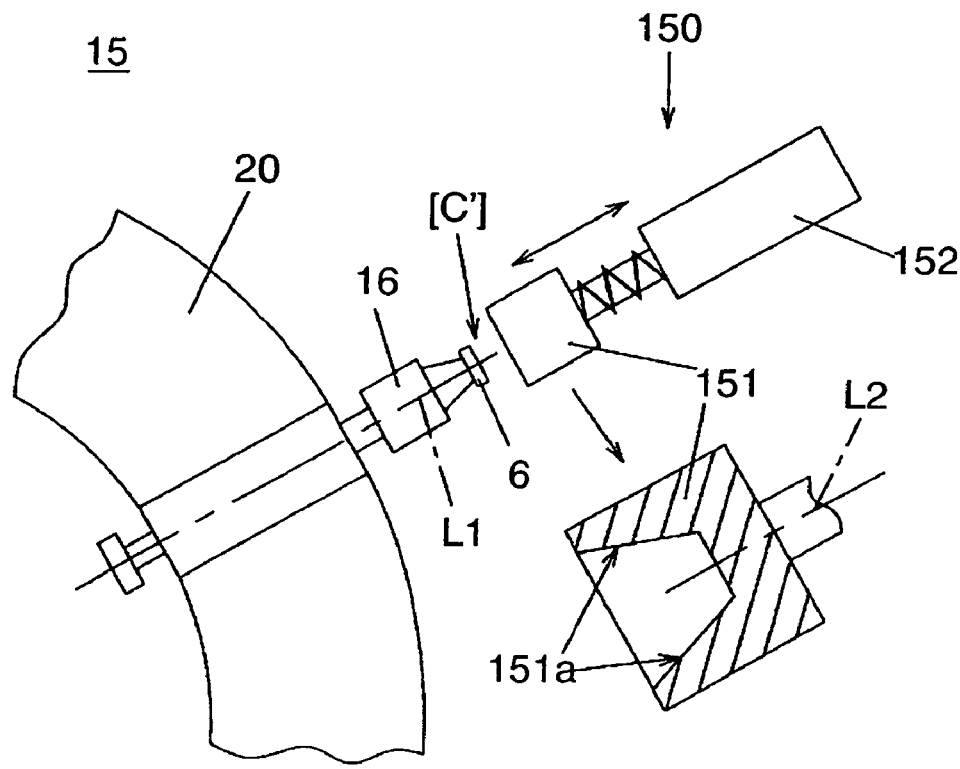
FIG. 11A is a fragmentary front view of a chip takeout and transfer mechanism of the electronic component placement machine in accordance with the preferred embodiment of the present invention.
Figure 11B:
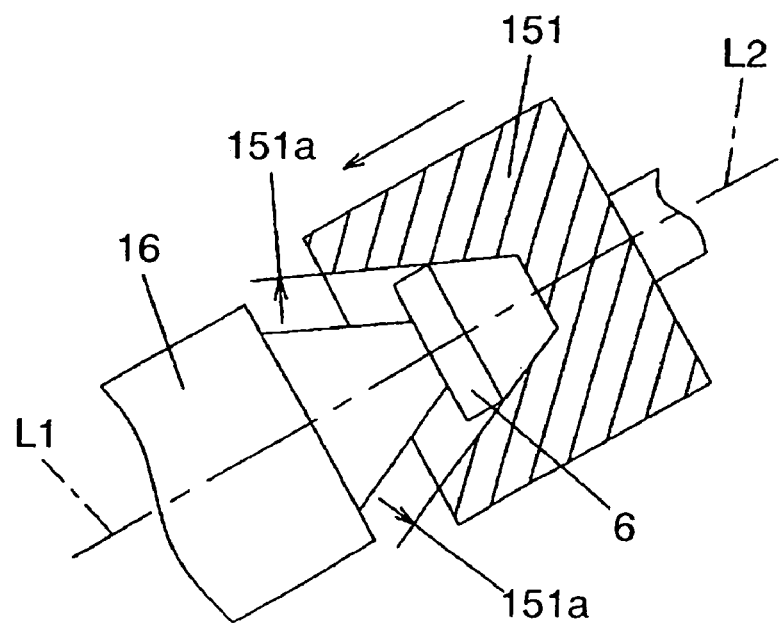
FIG. 11B illustrates precentering by the electronic component placement machine in accordance with the preferred embodiment of the present invention.

The above preferred embodiment describes an example of pre-centering for passing chip 6 from TTH 16 to placement head 14, or relative positioning of chip 6 and placement head 14, by controlling the takeout and transfer device and the placement head driving mechanism based on a positional recognition result obtained by capturing an image of chip 6 at pre-centering recognition position [C]. However, it is naturally acceptable to adopt mechanical alignment as shown in FIGS. 11A and 11B for pre-centering. In FIGS. 11A and 11B, bumps of chip 6 are not indicated.

In FIG. 11A, chip alignment mechanism 150, which is a pre-centering device, is disposed around pre-centering position [C'] (same as pre-centering recognition position [C] in FIGS. 3 and 4) set to TTH base 20 of chip takeout and transfer mechanism 15. Chip alignment mechanism 150 is configured in such a way that alignment tool 151 having internally tapered alignment face 151a can be moved back and forth in a normal direction by forwarding mechanism 152. Alignment center line L2 of alignment tool 151 is disposed in such a way as to match shaft line L1 of TTH 16 at pre-centering position [C'].

When TTH 16 holding chip 6 stops at pre-centering position [C'], alignment tool 151 moves forward to TTH 16 via forwarding mechanism 152 so that alignment face 151a contacts an end face of chip 6. Chip 6, still held by TTH 16, then moves along alignment face 151a. As a result, a center of chip 6 matches alignment center line L2 even though chip 6 is positionally deviated relative to TTH 16, and thus chip 6 is positioned centrally relative to shaft line L1 of TTH 16, which is a normal position.

Accordingly, when TTH 16 holding this chip 6 moves to receiving position [D] and passes chip 6 to placement head 14, placement head 14 can always receive chip 6 at a certain normal position. In other words, in an example shown in FIGS. 11A and 11B, chip alignment mechanism 150 (pre-centering device) which positions chip 6, held by TTH 16, to a normal position, during a middle of a takeout and transfer operation, acts as a second positioning device for positioning chip 6 relative to placement head 14.

Also in this case, TTH 16 upon reaching receiving position [D] can immediately pass chip 6, positioned at the normal position by placement head 14, through pre-centering of chip 6 to the normal position of TTH 16 in advance during transfer to receiving position [D].

The present invention described above has the following effects.

A placement head camera unit for capturing an image of an electronic component, held by a placement head, is disposed underneath a receiving position where the placement head receives the electronic component from TTH, and TTH is movable to a position that does not hinder image capture by the placement head camera unit. This eliminates a need for stopping the placement head from holding the electronic component for recognizing the component, and thus the present invention reduces cycle time and improves productivity.

An image of the electronic component held by TTH is captured during transfer of the electronic component, removed by TTH, to a receiving position so as to previously recognize a position for receiving the electronic component by the placement head. Or, pre-centering for positioning the electronic component held by TTH relative to a normal position is executed during removal and transfer. These operations eliminate a need for retracting the placement head from the receiving position for pre-centering recognition, thereby reducing cycle time and improving productivity.

Furthermore, the present invention adopts a configuration to elevate TTH for passing an electronic component from TTH to a placement head in a transfer position. This enables setting of a shorter elevating stroke for the placement head. Accordingly, both positional accuracy and high-speed operation are achieved by reducing weight of the placement head. Productivity can thus be improved by reducing cycle time while securing mounting accuracy.

The present disclosure relates to subject matter contained in priority Japanese Patent Application No. 2003-47313 and No. 2003-47314, filed on Feb. 25, 2003, and No. 2003-118274, filed on Apr. 23, 2003, the contents of which is herein expressly incorporated by reference in its entirety.

The present invention offers an electronic component placement machine and electronic component placement method that improves productivity by reducing cycle time while securing mounting accuracy.

What is claimed is:

1. An electronic component placement machine comprising:
   a takeout and transfer head;
   a feeder for supplying an electronic component to said takeout and transfer head at a feeding position;
   a board holder for holding a board onto which the electronic component is to be placed;
   a feeder camera unit for capturing an image of the electronic component while in said feeder;

a takeout positioning device for positioning the electronic component relative to said takeout and transfer head based on a positional recognition result of the electronic component obtained by recognizing the image captured by said feeder camera unit;

a takeout and transfer device for causing said takeout and transfer head to remove the electronic component from said feeder at the feeding position, and for flipping the electronic component while transferring the electronic component to a receiving position;

a placement head for receiving the electronic component from said takeout and transfer head at the receiving position, and for placing the electronic component onto the board;

a placement head camera unit for capturing an image of the electronic component, while held by said placement head at the receiving position, from beneath said placement head; and a placement positioning device for positioning the electronic component, while held by said placement head, relative to the board, while held by said board holder, based on a positional recognition result of the electronic component obtained by recognizing the image captured by said placement head camera units, wherein said feeder camera unit and said placement head camera unit are disposed such that respective apertures thereof are vertically overlaid with respect to each other.

2. The electronic component placement machine according to claim 1, wherein said feeder camera unit is for capturing the image of the electronic component, while in said feeder, from above said feeder, and said takeout and transfer head is movable to a position where capturing of the image by said feeder camera unit is not hindered.

3. An electronic component placement machine comprising:

a takeout and transfer head;

a placement head;

a feeder for supplying an electronic component to said takeout and transfer head at a feeding position;

a board holder for holding a board onto which the electronic component is to be placed;

a feeder camera unit for capturing an image of the electronic component while in said feeder;

a first positioning device for positioning the electronic component relative to said takeout and transfer head based on a positional recognition result of the electronic component obtained by recognizing the image captured by said feeder camera unit;

a takeout and transfer device for causing said takeout and transfer head to remove the electronic component from the feeding position, and for causing said takeout and transfer head to flip the electronic component while transferring the electronic component to a receiving position a second positioning device for positioning the electronic component, after having been removed from the feeding position, relative to said placement head, wherein said placement head is for receiving this relatively positioned electronic component from said takeout and transfer head at the receiving position and placing the electronic component onto the board;

a placement head camera unit for capturing an image of the electronic component, while held by said placement head, from beneath said placement head; and a third positioning device for positioning the electronic component, while held by said placement head, relative to the board, while held by said board holder, based on a positional recognition result of the electronic component obtained by recognizing the image captured by said placement head camera units, wherein said feeder camera unit and said placement head camera unit are disposed such that respective apertures thereof are vertically overlaid with respect to each other.

4. The electronic component placement machine according to claim 3, further comprising:

a placement head driving mechanism for moving said placement head, wherein said second positioning device comprises
(i) a takeout and transfer head camera unit for capturing an image of the electronic component, while held by said takeout and transfer head during removal of the electronic component from the feeding position and transferring of the electronic component to the receiving position, and
(ii) a positioning controller for positioning said placement head relative to the electronic component, while held by said takeout and transfer head at the receiving position, by controlling at least one of said takeout and transfer device and said placement head driving mechanism based on the image captured by said takeout and transfer head camera unit.

5. The electronic component placement machine according to claim 3, wherein said second positioning device comprises a pre-centering device for positioning the electronic component, while held by said takeout and transfer head, to a normal position during removal of the electronic component from the feeding position and transferring of the electronic component to the receiving position.

6. An electronic component placement machine comprising:

a takeout and transfer head;

a placement head;

a feeder for supplying an electronic component to said takeout and transfer head at a feeding position set to a height of a component feeding level;

a takeout and elevating device for vertically moving said takeout and transfer head at the feeding position;

a board holder for holding a board, onto which the electronic component is to be placed, at a board holding level, with the board holding level being higher than the component feeding level;

a feeder camera unit for capturing an image of the electronic component while in said feeder;

a takeout positioning device for positioning the electronic component relative to said takeout and transfer head based on a positional recognition result of the electronic component obtained by recognizing the image captured by said feeder camera unit;

a transfer and flipping device for causing said takeout and transfer head to remove the electronic component from said feeder at the feeding position, and for flipping the electronic component while transferring the electronic component to a transfer position which is set to a component transfer level, with the component transfer level being higher than the component feeding level;

a transfer and elevating device for vertically moving said takeout and transfer head at the transfer position;

a placement head transfer mechanism for moving said placement head relative to said board holder, wherein said placement head is to receive said electronic component, after having been flipped, from said takeout and transfer head at the transfer position; and a placement head camera unit for capturing an image of the electronic component, while head by said placement head, from beneath said placement head.

wherein said feeder camera unit and said placement head camera unit are disposed such that respective apertures thereof are vertically overlaid with respect to each other.

7. The electronic component placement machine according to claim 6, further comprising:

a common driving source for driving said takeout and elevating device and said transfer and elevating device.

8. The electronic component placement machine according to claim 6, wherein said feeder camera unit includes an aperture that is provided at a position which vertically overlays the feeding position and the transfer position.

* * * * *